United States Patent
Inoue

(10) Patent No.: US 8,464,872 B2
(45) Date of Patent: Jun. 18, 2013

(54) SUBSTRATE STORAGE CONTAINER

(75) Inventor: Shuichi Inoue, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 0 days.

(21) Appl. No.: 13/634,499

(22) PCT Filed: Apr. 20, 2010

(86) PCT No.: PCT/JP2010/056967
§ 371 (c)(1), (2), (4) Date: Sep. 12, 2012

(87) PCT Pub. No.: WO2011/132257
PCT Pub. Date: Oct. 27, 2011

(65) Prior Publication Data
US 2013/0037444 A1    Feb. 14, 2013

(51) Int. Cl.
*B65D 85/86* (2006.01)
*B65D 85/30* (2006.01)

(52) U.S. Cl.
USPC .......................... 206/711; 206/710; 206/454

(58) Field of Classification Search
USPC ............... 206/711, 710, 712, 832, 833, 722, 206/723, 725, 454; 211/41.18
See application file for complete search history.

(56) References Cited

U.S. PATENT DOCUMENTS

| | | | |
|---|---|---|---|
| 6,267,245 B1 * | 7/2001 | Bores et al. | 206/711 |
| 7,100,772 B2 * | 9/2006 | Burns et al. | 206/710 |
| 7,344,031 B2 * | 3/2008 | Hasegawa et al. | 206/710 |
| 7,900,776 B2 * | 3/2011 | Burns et al. | 206/711 |
| 7,922,000 B2 * | 4/2011 | Hyobu | 206/454 |
| 8,318,275 B2 * | 11/2012 | Kudo et al. | 428/35.7 |
| 2005/0247594 A1 * | 11/2005 | Mimura et al. | 206/710 |
| 2005/0274645 A1 * | 12/2005 | Hasegawa et al. | 206/710 |
| 2006/0283774 A1 * | 12/2006 | Hasegawa et al. | 206/725 |
| 2007/0295638 A1 * | 12/2007 | Nakatogawa | 206/711 |

FOREIGN PATENT DOCUMENTS

| | | |
|---|---|---|
| JP | H10-233438 | 9/1998 |
| JP | H11-121603 | 4/1999 |
| JP | 2003-522078 | 7/2003 |
| JP | 2005-340264 | 12/2005 |
| WO | WO 00/02798 | 1/2000 |

OTHER PUBLICATIONS

The International Bureau, Notification of the Recording of a Change for PCT Application No. PCT/JP2010/056967, mail date Apr. 5, 2012.
Japan Patent Office, International Search Report for PCT Application No. PCT/JP2010/056967, mail date Jul. 13, 2010.

* cited by examiner

*Primary Examiner* — Steven A. Reynolds
(74) *Attorney, Agent, or Firm* — SoCal IP Law Group LLP; Steven C. Sereboff; John E. Gunther

(57) ABSTRACT

When a lid (20) is attached to a substrate removal/insertion opening (2) in a container body (1), a placement piece forcible displacement means (22) forcibly moves a substrate placement piece (4), which is provided in a region in the vicinity of the substrate removal/insertion opening (2), to a displacement position which does not overlap with a disc-shaped substrate (W). Thus, even if the disc-shaped substrate (W) is increased in diameter, there is no risk of the stored disc-shaped substrate (W) coming into contact with the substrate placement piece (4) due to factors such as vibration or impact, thus the disc-shaped substrate (W) can be stored more safely.

4 Claims, 7 Drawing Sheets

[IV]

[V]

[VIII]

[IX]

[XI]

[XII]

SUBSTRATE STORAGE CONTAINER

TECHNICAL FIELD

The present invention relates to a substrate storage container for storing a plurality of thin disc-shaped substrates such as semiconductor wafers, circular quartz glass substrates, and the like for the purpose of storage, transportation, and the like.

BACKGROUND ART

A substrate storage container is generally provided with a container main body for storing a plurality of disc-shaped shape substrates such as semiconductor wafer in a parallel manner therein. A substrate transfer opening for transferring the disc-shaped substrate is formed in the container main body. Then, a lid body for sealing the substrate transfer opening is provided so as to be mounted in a detachable manner from outside to the substrate transfer opening.

In order to hold the disc-shaped substrate inside the container main body in a state without rattling, a back side supporting portion is disposed at a back side area inside of the container main body as seen from the substrate transfer opening, and a lid side retainer is provided at an inner wall portion of a lid body.

However, the lid side retainer does not enter a state of holding the disc-shaped substrate until the lid body is mounted to the substrate transfer opening of the container main body. For this reason, a substrate placement piece is provided for placing the disc-shaped substrate at an area proximal to the substrate transfer opening, during a state in which the lid body is not mounted. When the disc-shaped substrate enters a state held by the lid side retainer, the disc-shaped substrate is brought into a state floating from the substrate placement piece (for example, Japanese Unexamined Patent Application (Translation of PCT Publication), Publication No. 2003-522078; FIG. 10, etc.).

DISCLOSURE OF THE INVENTION

Problems to be Solved by the Invention

Recently, advancements have been made in increasing the diameter of semiconductor wafers and the like with the purpose of productivity improvement, cost reduction, and the like. In the case of semiconductor wafers, 300 mm is currently predominant for the diameter; however, it is expected that the diameter will reach 450 mm in the near future.

When vibration, impact and the like acts on the substrate storage container, deflecting occurs in the disc-shaped substrates stored inside thereof. The amount of such deflecting on the disc-shaped substrates becomes significantly greater as the diameter of the disc-shaped substrate increases. This is because the thickness of the disc-shaped substrate cannot increase in correspondence with the diameter.

Therefore, when the disc-shaped substrate deflects by vibration or impact acting on the substrate storage container, the disc-shaped substrate being held in a state floating from the substrate placement piece inside of the substrate storage container may contact (or hit) the substrate placement piece and be damaged or contaminated in the substrate storage container.

It is an object of the present invention to provide a substrate storage container in which, even if a disc-shaped substrate stored is deflected due to vibration, impact, etc., there is no risk of the substrate contacting a substrate placement piece, and even disc-shaped substrates of increased diameter can be safely stored.

Means for Solving the Problems

In order to achieve the abovementioned object, a substrate storage container of the present invention includes: a substrate storage container including: a container main body that stores a plurality of disc-shaped substrates in a parallel manner; a substrate transfer opening that is formed in the container main body in order to transfer the disc-shaped substrates in the container main body; a lid body that is attached in a detachable manner to the substrate transfer opening from outside in order to seal the substrate transfer opening; a back side supporting portion that positions and holds each of the disc-shaped substrates in a back side area inside of the container main body as seen from the substrate transfer opening; a lid side retainer that is provided at an inner wall portion of the lid body and that positions and holds each of the disc-shaped substrates; and a substrate placement piece on which the disc-shaped substrate is placed at an area proximal to the substrate transfer opening, when the lid body is not attached to the substrate transfer opening, in which the substrate placement piece is provided so as to be movable between a supporting position overlapping with the disc-shaped substrate, as seen from a vertical direction with respect to a surface of the disc-shaped substrate, and enabling the disc-shaped substrate to be placed thereon, and a retracted position not overlapping with the disc-shaped substrate, and in which the substrate storage container further includes: a placement piece forced retraction means that forcibly moves the substrate placement piece to the retracted position accompanying the lid body being attached to the substrate transfer opening; and a placement piece return means that causes the substrate placement piece to return to the supporting position when the lid body enters a state not attached to the substrate transfer opening.

Furthermore, the placement piece forced retraction means may be provided to the lid body, and the placement piece forced retraction means is a sloped face that is formed at an inner face wall of the lid body, the sloped face abutting a member that is provided in a linked manner to the substrate placement piece accompanying the lid body being attached to the substrate transfer opening, so as to move the member provided in a linked manner to the substrate placement piece, whereby the substrate placement piece may move to the retracted position.

Furthermore, the placement piece return means is a return spring that biases the substrate placement piece towards the supporting position, and the return spring may be elastically deformed by the placement piece forced retraction means when the lid body is attached to the substrate transfer opening, and the return spring may return to a state prior to being elastically deformed and cause the substrate placement piece to return to the supporting position, when the lid body is removed from the substrate transfer opening.

Effects of the Invention

According to the present invention, as the lid body is attached to the substrate transfer opening of the container main body, the placement piece forced retraction means forcibly moves the substrate placement piece to the retracted position where the substrate placement piece does not overlap with the disc-shaped substrate. Therefore, it is not likely that the disc-shaped substrate stored is in contact with the substrate temporal placement piece due to vibration, impact, etc., even if the disc-shaped substrate is set to have a larger diameter thereof. Therefore, a disc-shaped substrate such as a semiconductor wafer, a quartz glass substrate, and the like can be safely stored.

Figure 1:
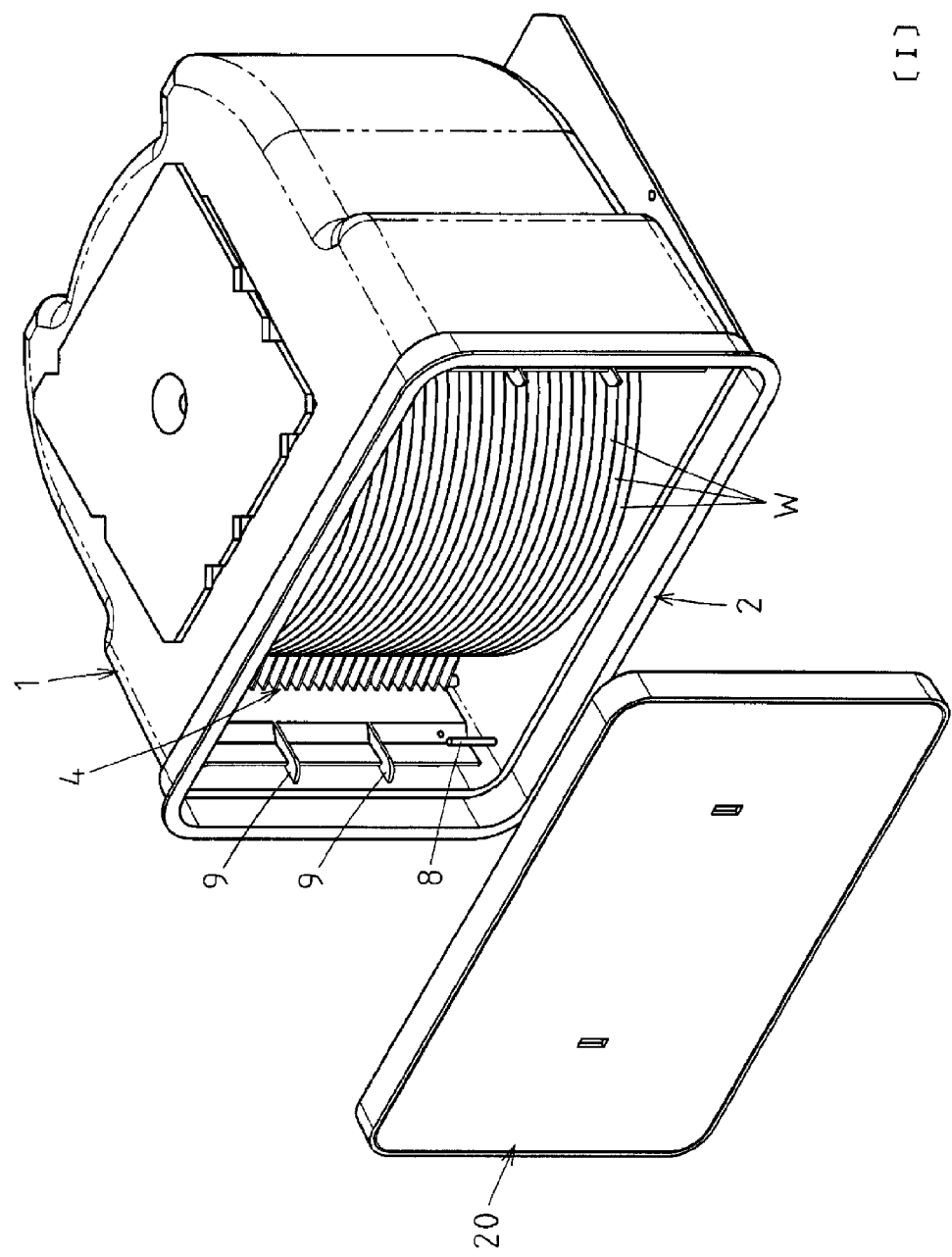
FIG. 1 is a perspective view of an outer appearance of a substrate storage container according to a first embodiment of the present invention in a state with a lid body removed.

EXPLANATION OF REFERENCE NUMERALS 1 container main body
2 substrate transfer opening
3 back side supporting portion
4 substrate placement piece
6 easily-foldable part
7 return spring (placement piece return means)
8 stopper pin
9 functional piece
11 spindle
20 lid body
21 lid side retainer
22 sloped face (placement piece forced retraction means)
W disc-shaped substrate Preferred Mode For Carrying Out The Invention In the following, embodiments of the present invention are explained with reference to the drawings.

Figure 2:
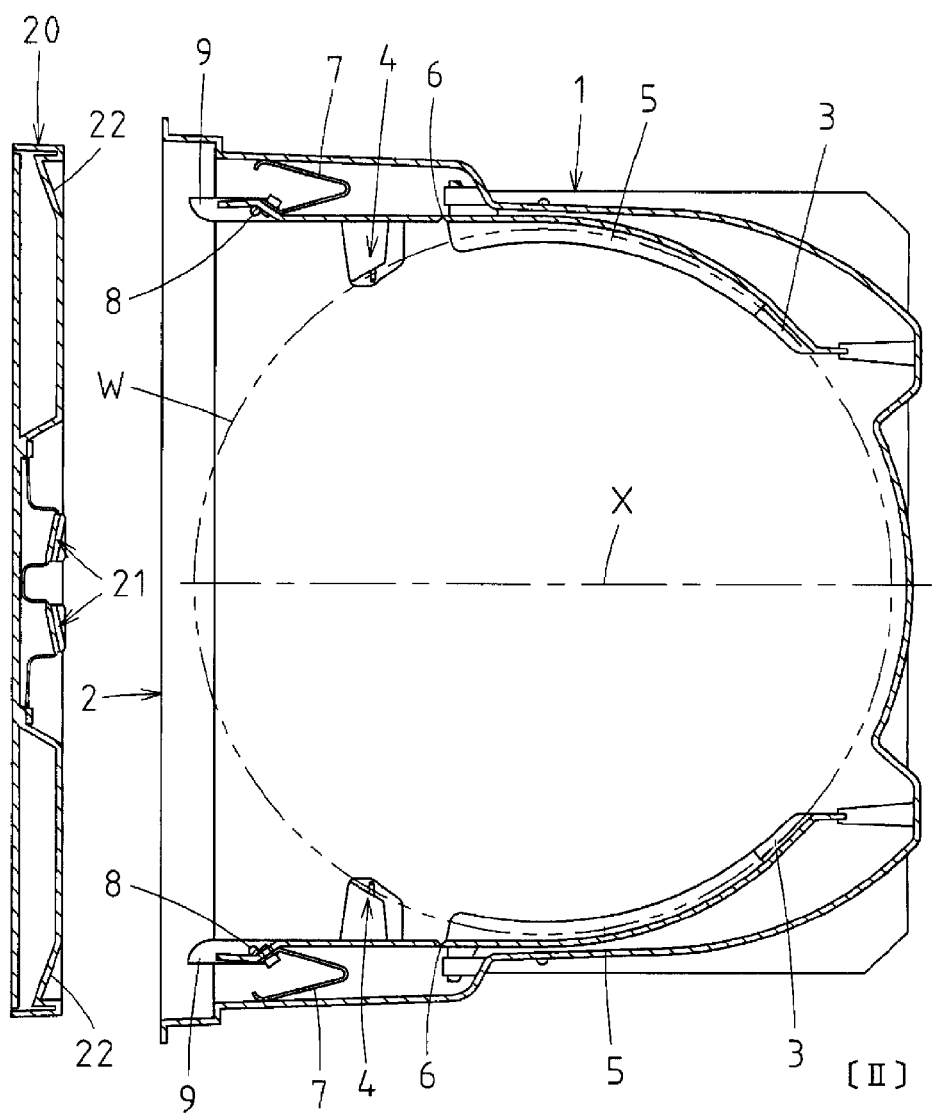
FIG. 2 is a plane cross-sectional view of the substrate storage container according to the first embodiment of the present invention in a state with the lid body removed.

FIG. 1 is a perspective view of a substrate storage container according to a first embodiment of the present invention, and FIG. 2 is a plane cross-sectional view thereof. However, disc-shaped substrates W are illustrated with solid lines in FIG. 1 and a disc-shaped substrate W is illustrated with a two-dot dashed line in FIG. 2.

The reference numeral 1 is a container main body for storing, in a parallel manner, a plurality of disc-shaped substrates W formed in a thin disc shape. The container main body 1 is arranged so that each disc-shaped substrate W is stored oriented in a horizontal (or oblique) direction, while the disc-shaped substrate W is transferred. In addition, although the disc-shaped substrate W is a semiconductor wafer in this embodiment, it is not limited thereto, and may be a circular quartz glass substrate or the like.

With such a configuration, a substrate transfer opening 2 for transferring the disc-shaped substrates W is formed at one face among the four faces of the container main body 1. Then, a lid body 20 for sealing the substrate transferring opening 2 is provided so as to be attached in a detachable manner from the outside to the substrate transfer opening 2.

In addition, although a sealing member having elasticity for sealing between the substrate transfer opening 2 and a peripheral portion of the lid body 20, a locking mechanism for locking the lid body 20, and the like are provided, illustrations thereof are omitted.

Known back side supporting portions 3 are arranged in a back side area in the container main body 1 as seen from the substrate transfer opening 2. The back side supporting portions 3 hold and position an outer edge portion of each disc-shaped substrate W. As shown in FIG. 2, the back side supporting portions 3 are arranged in pairs, which are provided to be spaced apart on the right side and left side from the center line X (the center line of the container main body 1 in a vertical direction with respect to the substrate transfer opening 2), as seen from the substrate transfer opening 2. The back side supporting portions 3 will be described later in detail.

In addition, known lid side retainers 21 are provided at an inner wall portion of the lid body 20. The lid side retainers 21 hold and position an outer edge portion of each disc-shaped substrate W by elastically pressing each from a side of the substrate transfer opening 2 toward a side of the back side supporting portion 3.

The lid side retainer 21 includes a configuration in which a V-shaped groove portion that abuts a peripheral portion of each disc-shaped substrate W is supported by a supporting member that is easily elastically deformed when the lid body 20 is attached to the substrate transfer opening 2 of the container main body 1. The lid side retainer 21 is provided proximal to the position of the center line X.

Substrate placement pieces 4 are provided at positions that are at proximal regions to the substrate transfer opening 2 in the container main body 1 and separated from the center line X (i.e. proximal positions to right and left walls of the container main body 1). The substrate placement pieces 4 have placed thereon an outer edge portion of the disc-shaped substrate W when the lid body 20 is in a state of not being attached to the substrate transfer opening 2.

As shown in FIG. 2, groove shelves 5 are formed to run between the substrate placement piece 4 and the back side supporting portion 3 providing loose gaps for the disc-shaped substrates W. The groove shelves 5 guide an outer edge portion of the disc-shaped substrates W when transferring the disc-shaped substrates W into the container main body 1 manually, etc. The groove shelves 5 are not required in a case of the disc-shaped substrates W being transferred by an automatically-controlled robot hand or the like.

Figure 3:
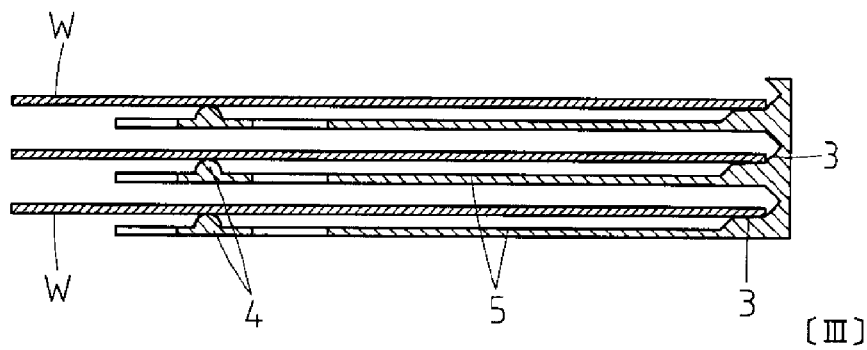
FIG. 3 is a partial lateral cross-sectional view of the substrate storage container according to the first embodiment of the present application in a state with the lid body removed.

FIG. 3 schematically illustrates a partial lateral cross section of the back side supporting portion 3, the substrate placement piece 4, the groove shelves 5, and the disc-shaped substrates W placed thereon. The back side supporting portion 3 and the substrate placement piece 4 include a face for placing the disc-shaped substrate W at a higher position than the groove shelf 5.

Thus, in a state with the lid body 20 not attached to the substrate transfer opening 2 of the container main body 1, the outer edge portion of each disc-shaped substrate W is held in a state of being placed on the back side supporting portion 3 and the substrate placement piece 4.

A peripheral portion of the back side supporting portion 3 is formed in a V-shaped groove with a side far from the center of the disc-shaped substrate W being defined as a bottom. Therefore, when each disc-shaped substrate W is pushed to a side of the back side supporting portion 3 from a side of the substrate transfer opening 2, an edge line portion of the periphery thereof is pressed to the V-shaped groove portion of the back side supporting portion 3, and each disc-shaped substrate W is brought into a state floating above the lower face of the back side supporting portion 3 on which each disc-shaped substrate W is placed (refer to FIG. 9).

Figure 4:
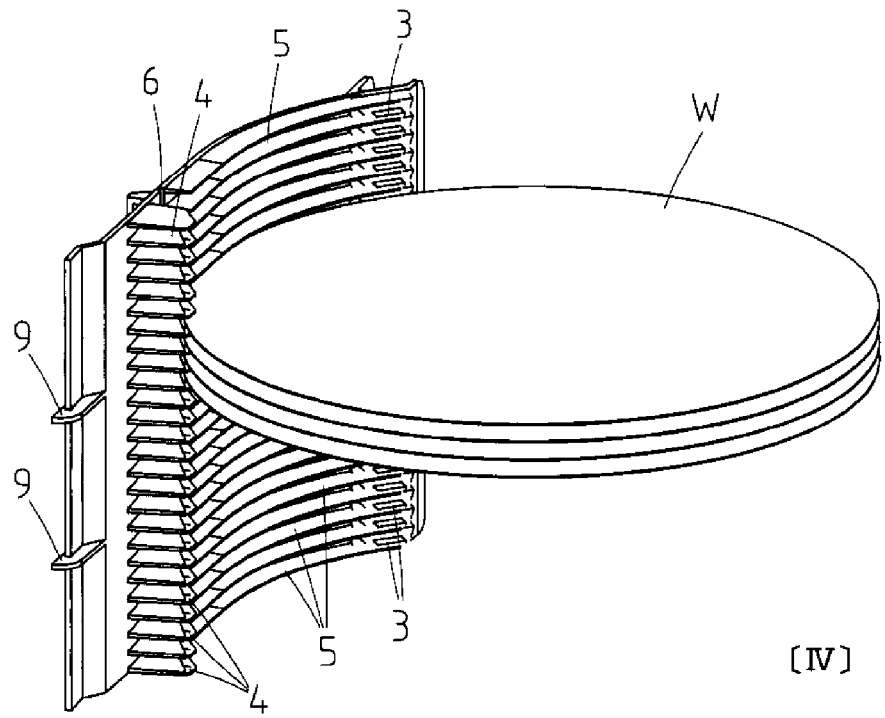
FIG. 4 is a partial perspective view of the substrate storage container according to the first embodiment of the present invention in a state with a substrate placement piece being located at a supporting position.

The back side supporting portion 3, the substrate placement piece 4, and the groove shelves 5 thus formed, having an outer appearance as illustrated in FIG. 4, are arranged in a vertically stacked state to match the number of the disc-shaped substrate W to be stored and are formed integrally and continuously from a plastic material. It should be noted that, although the back side supporting portion 3, the substrate placement piece 4, and the groove shelves 5 that are located at one side in the container main body 1 are illustrated in FIG. 4, parts of a symmetrical shape (not illustrated) thereto are also arranged at the other side.

As shown in FIG. 2, etc., a locally thinned easily-foldable part 6 is formed at a wall portion of a portion connecting the substrate placement piece 4 with the groove shelf 5. However, the configuration of the easily-foldable part 6 can assume various forms such as connecting two components to be rotatable, for example.

Figure 8:
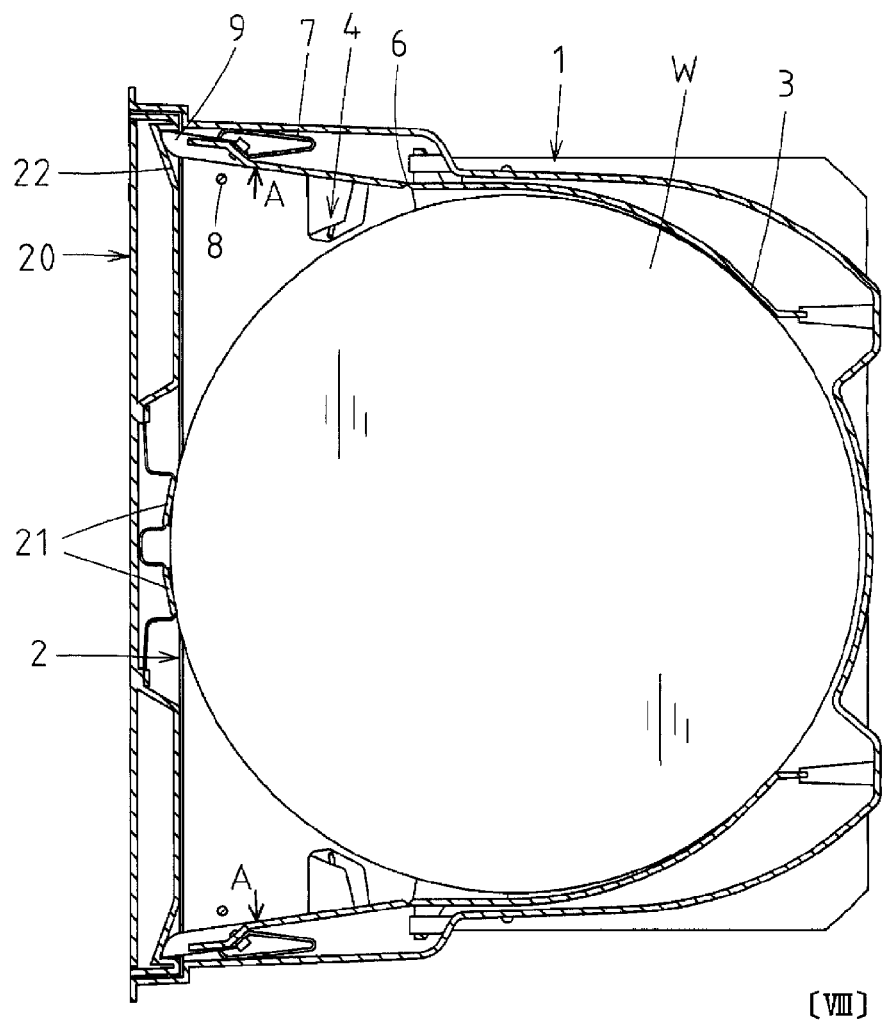
FIG. 8 is a plane cross-sectional view of the substrate storage container according to the first embodiment of the present invention in a state with the lid body attached.

By the substrate placement piece 4 moving rotationally about the easily-foldable part 6, the substrate placement piece 4 can move between a supporting position (refer to FIG. 2 and the like) and a retracted position as illustrated in FIG. 8 described later. The supporting position overlaps with the disc-shaped substrate W, as seen from a vertical direction with respect to a surface of the disc-shaped substrate W, and enabling the disc-shaped substrate W to be placed thereon. The retracted position does not overlap with the disc-shaped substrate W (therefore, not enabling the disc-shaped substrate W to be placed thereon).

Figure 5:
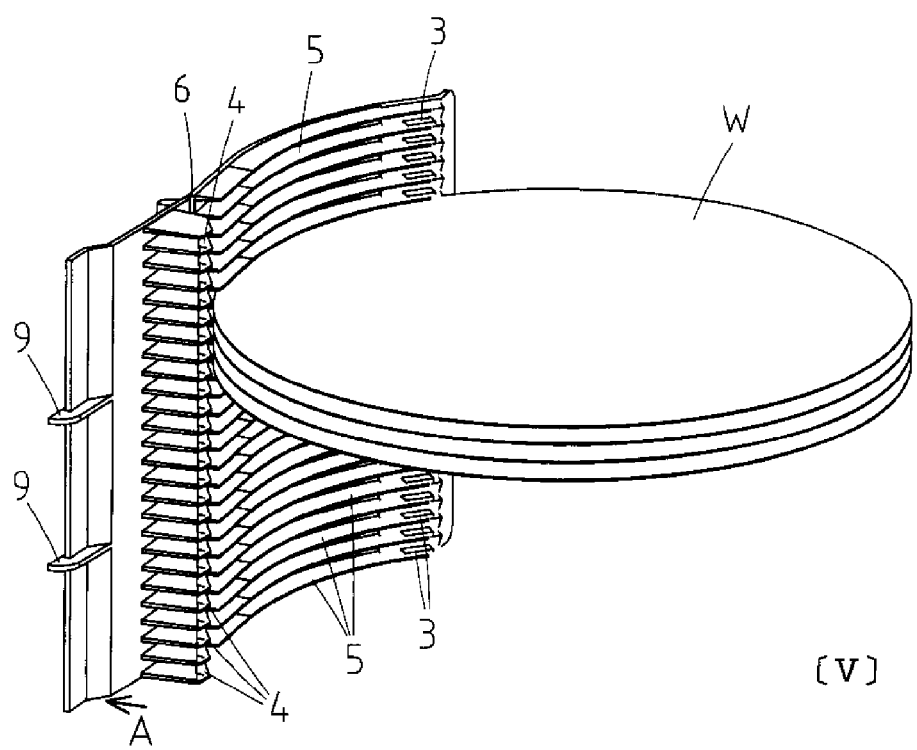
FIG. 5 is a partial perspective view of the substrate storage container according to the first embodiment of the present invention with the substrate placement piece being located at a retracted position.

In addition, FIG. 4 illustrates a state in which the substrate placement piece 4 is located at a supporting position. FIG. 5 illustrates a state in which the substrate placement piece 4 has moved to the retracted position by rotating in the arrow A direction about the easily-foldable part 6.

A return spring 7 (a placement piece return means) is provided to be sandwiched between a lateral wall of the container main body 1 and a member integrally connected to the substrate placement piece 4. The return spring 7 biases the substrate placement piece 4 from a lateral side to a side of the disc-shaped substrate W. In this embodiment, the return spring 7 is an independent component and is attached by means of a threaded fastener.

Then, a stopper pin 8 is provided to project from a floor face of the container main body 1. The stopper pin 8 prevents the substrate placement piece 4 pushed by the return spring 7 from moving inwards in the container main body 1 more than a certain extent. As a result, the operation of transferring the disc-shaped substrate W to inside of the container main body 1 from the substrate transfer opening 2 is not inhibited by the substrate placement piece 4.

The reference numeral 9 shown in each drawing from FIG. 1 through FIG. 5 except for FIG. 3 refers to a functional piece 9. The functional piece 9 is provided in a linked manner integrally with the substrate placement piece 4 so as to be established as a functioning point for allowing the substrate placement piece 4 to move about the easily-foldable part 6. The functional piece 9 is formed to project in a plate shape from an inner side of the container main body 1 towards the location of the substrate transfer opening 2.

Sloped faces 22 (placement piece forced retraction means) are respectively formed on both left and right sides at an inner face wall of the lid body 20. When the lid body 20 is attached to the container main body 1 so as to seal the substrate transfer opening 2 of the container main body 1, the sloped face 22 abuts the functional piece 9, causing the functional piece 9 to move, thereby causing the substrate placement piece 4 to forcibly move to the retracted position.

Figure 6:
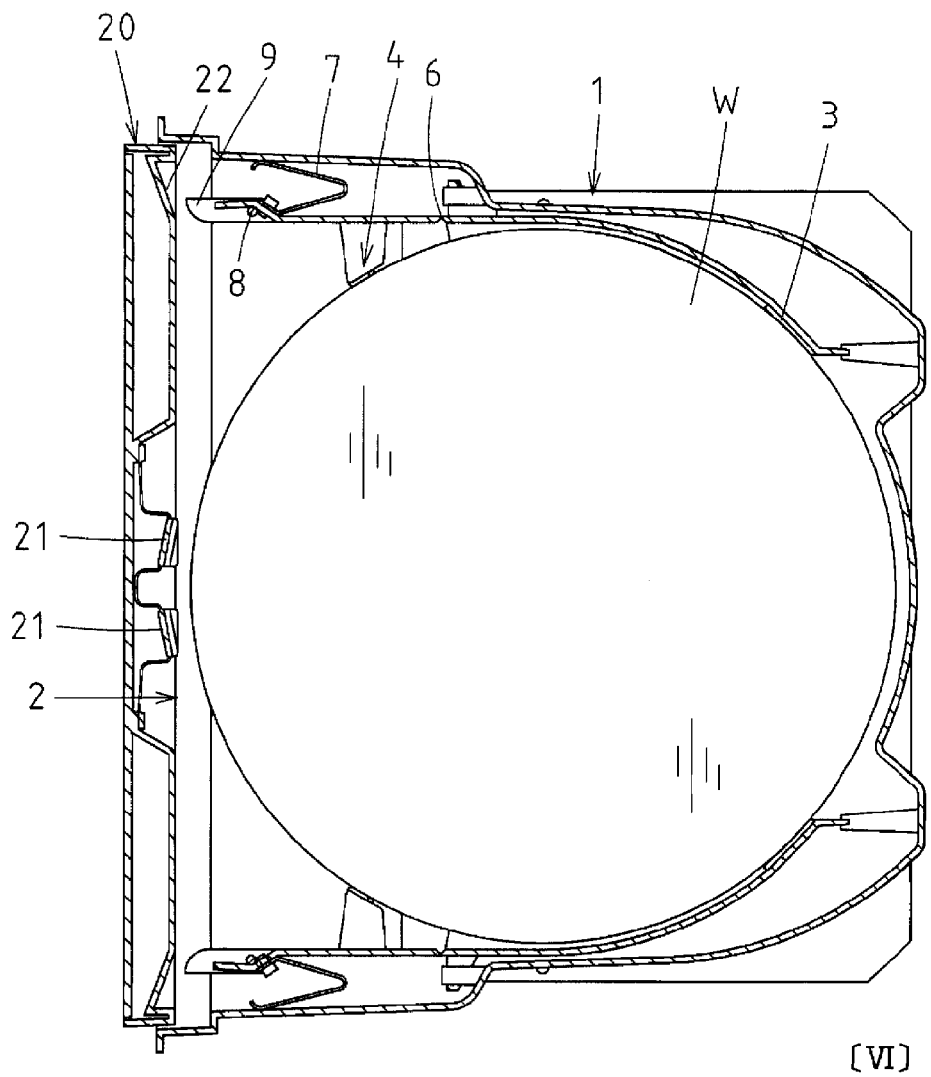
FIG. 6 is a plane cross-sectional view of the substrate storage container according to the first embodiment of the present invention in a state immediately before the lid body is attached.
Figure 7:
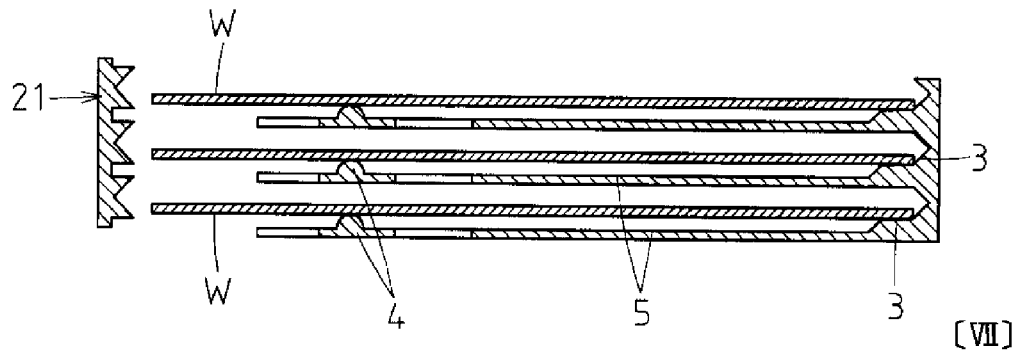
FIG. 7 is a partial lateral cross-sectional view of the substrate storage container according to the first embodiment of the present invention in a state immediately before the lid body is attached.

FIG. 6 is a plane cross-sectional view illustrating a state immediately before the lid body 20 is attached so as to seal the substrate transfer opening 2 of the container main body 1. FIG. 7 is a view partially illustrating schematically a lateral cross-sectional view of its state. In this state, the disc-shaped substrate W is not pressed to inside of the container main body 1 from a side of the lid body 20. Therefore, similarly to when the lid body 20 is removed, a vicinity of an outer edge portion of the disc-shaped substrate W enters a state placed on the back side supporting portion 3 and the substrate placement piece 4.

Figure 9:
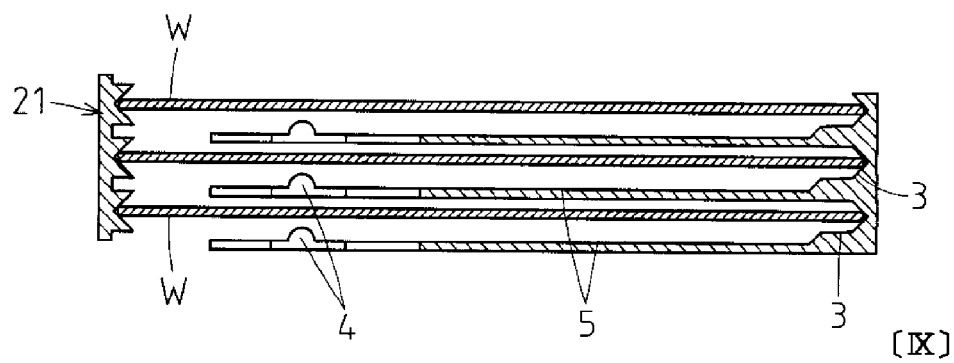
FIG. 9 is a partial lateral cross-sectional view of the substrate storage container according to the first embodiment of the present invention in a state with the lid body attached.

FIG. 8 is a plane cross-sectional view illustrating a state with the lid body 20 completely attached to the substrate transfer opening 2 of the container main body 1. FIG. 9 is a view partially illustrating schematically a lateral cross-sectional view of its state. In this state, the lid side retainer 21 is pressed elastically to the disc-shaped substrate W.

As a result, as illustrated in FIG. 9, a peripheral portion of each disc-shaped substrate W is guided by the lid side retainer 21 as well as a trough portion of each V-shaped groove portion of the back side supporting portion 3, and the disc-shaped substrate W stored in the container main body 1 enters a state floating above the substrate placement piece 4 and positioned and held so as not to rattle.

Simultaneously, as illustrated in FIG. 8, the functional piece 9 is pushed by the sloped face 22 of the lid body 20, which causes the return spring 7 to elastically deform against its biasing force. Then, the functional piece 9 causes the substrate placement piece 4 to rotate about the easily-foldable part 6 (arrow A) and causes the substrate placement piece 4 to forcibly move to the retracted position. The retracted position does not overlap with the disc-shaped substrate W as seen from a vertical direction with respect to a face of the disc-shaped substrate W.

Therefore, even if the disc-shaped substrates W are increased in diameter and the amount of deflecting due to vibration or impact becomes greater, there is no risk of the disc-shaped substrate W stored in the substrate storage container coming into contact with the substrate placement piece 4, and thus the disc-shaped substrate W can be stored safely.

Then, when the lid body 20 enters a state removed from the substrate transfer opening 2 of the container main body 1, the return spring 7 that is a placement piece return means returns to the state prior to elastic deformation, and the substrate placement piece 4 is returned to a supporting position positioned by the stopper pin 8, as illustrated in FIG. 2. It should be noted that the return spring 7 may be integrally molded with the substrate placement piece 4, the functional piece 9 and the like. The functional piece 9 may also include a structure that also serves as the return spring 7.

Figure 10:
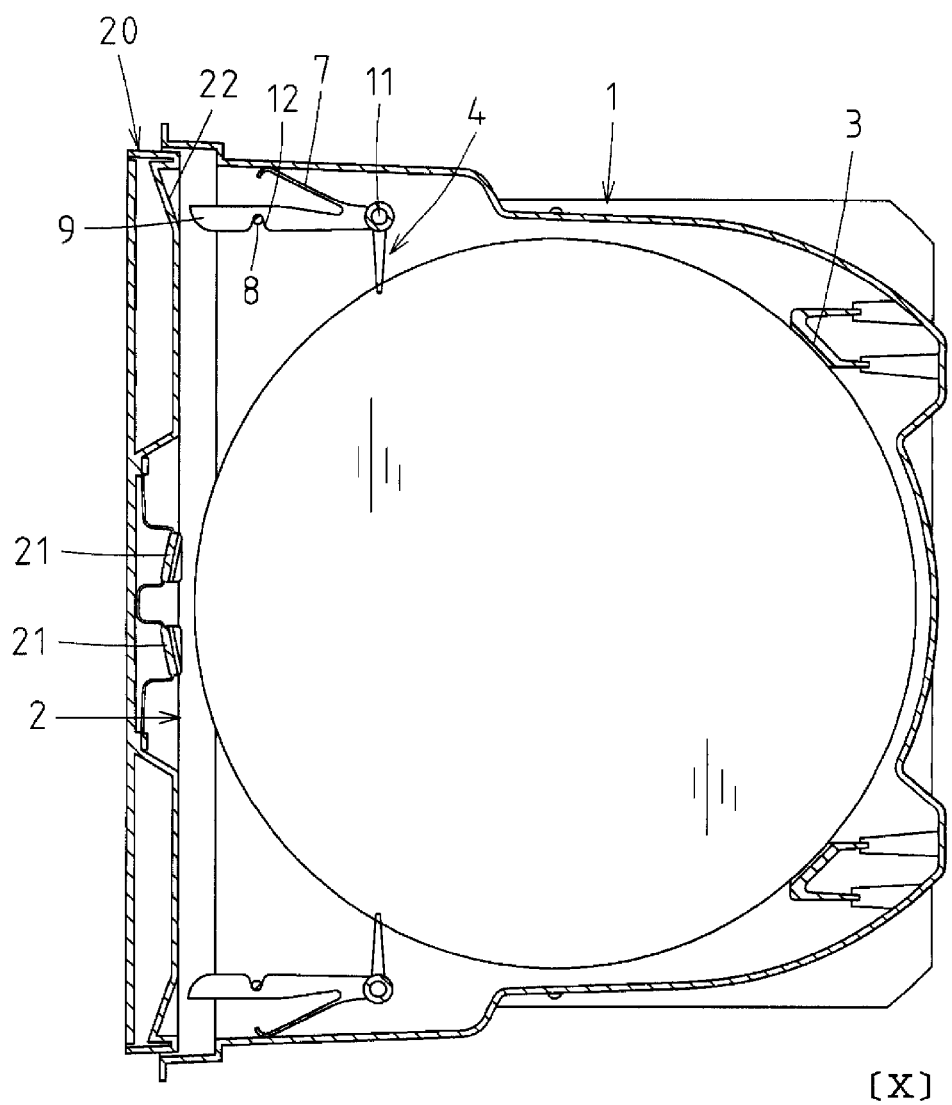
FIG. 10 is a plane cross-sectional view of the substrate storage container according to a second embodiment of the present invention immediately before the lid body being attached.
Figure 11:
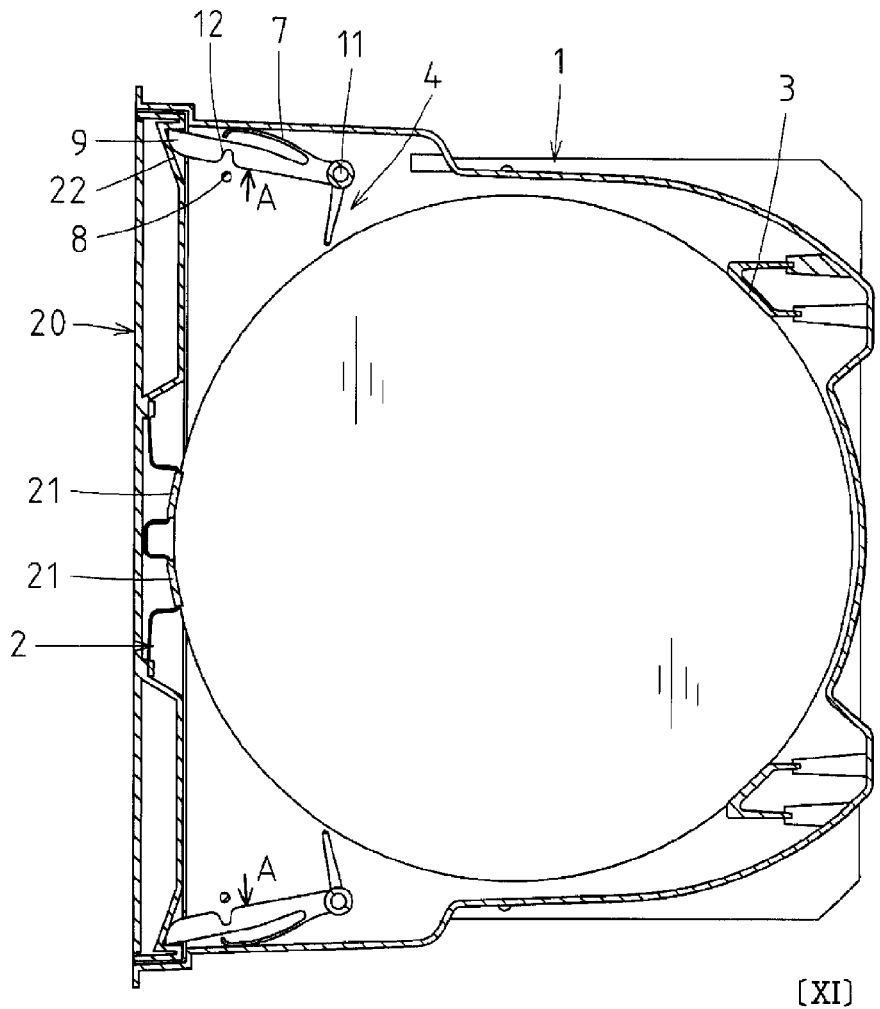
FIG. 11 is a plane cross-sectional view of the substrate storage container according to the second embodiment of the present invention in a state with the lid body attached.

FIGS. 10 and 11 illustrate a substrate storage container according to a second embodiment of the present invention. FIG. 10 illustrates a state immediately before the lid body 20 is attached to the substrate transfer opening 2 of the container main body 1. FIG. 11 illustrates a state with the lid body 20 completely attached to the substrate transfer opening 2.

Figure 12:
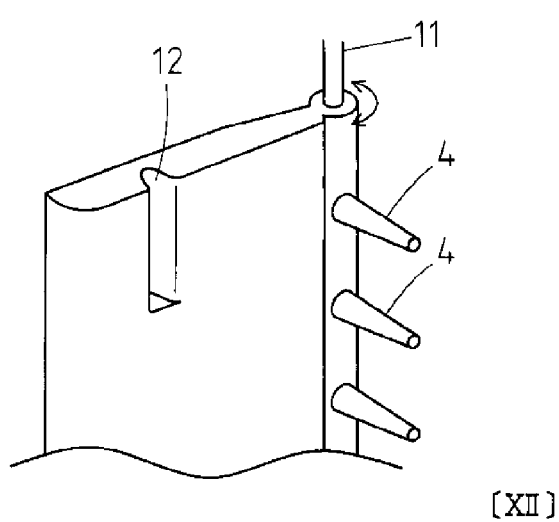
FIG. 12 is a partial perspective view of a substrate placement piece in the substrate storage container according to the second embodiment of the present invention.

In this embodiment, the groove shelf 5 provided in the aforementioned first embodiment is not provided. The substrate placement piece 4, as partially illustrated in FIG. 12, includes a configuration in which cone-shaped pins are arranged in parallel in a comb-shaped manner.

The substrate placement piece 4 is provided to be rotatable about a spindle 11, which is installed upright in the container main body 1. The return spring 7 is formed integrally with the substrate placement piece 4 from a plastic material. The reference number 12 refers to a depression into which the stopper pin 8 loosely fits.

For the substrate storage container of the embodiment configured in this way as well, similarly to the first embodiment, accompanying the lid body 20 being attached to the substrate transfer opening 2 of the container main body 1, the sloped face 22 formed at the lid body 20 abuts the functional piece 9, causing the functional piece 9 to rotate about the spindle 11. The substrate placement piece 4 is thereby made to move forcibly to the retracted position. Then, when the lid body 20 enters a state removed from the substrate transfer opening 2, the substrate placement piece 4 is returned to the supporting position by means of the return spring 7.

The invention claimed is:

1. A substrate storage container comprising:
 a container main body that stores a plurality of disc-shaped substrates in a parallel manner;
 a substrate transfer opening that is formed in the container main body in order to transfer the disc-shaped substrates in the container main body;
 a lid body that is attached in a detachable manner to the substrate transfer opening from outside in order to seal the substrate transfer opening;
 a back side supporting portion that positions and holds each of the disc-shaped substrates in a back side area inside of the container main body as seen from the substrate transfer opening;
 a lid side retainer that is provided at an inner wall portion of the lid body and that positions and holds each of the disc-shaped substrates; and
 a substrate placement piece on which the disc-shaped substrate is placed at an area proximal to the substrate transfer opening, when the lid body is not attached to the substrate transfer opening,
 wherein the substrate placement piece is provided so as to be movable between a supporting position overlapping with the disc-shaped substrate, as seen from a vertical direction with respect to a surface of the disc-shaped substrate, and enabling the disc-shaped substrate to be placed thereon, and a retracted position not overlapping with the disc-shaped substrate, and
 wherein the substrate storage container further comprises:
 a placement piece forced retraction means that forcibly moves the substrate placement piece to the retracted position accompanying the lid body being attached to the substrate transfer opening; and
 a placement piece return means that causes the substrate placement piece to return to the supporting position when the lid body enters a state not attached to the substrate transfer opening.

2. The substrate storage container according to claim 1, wherein the placement piece forced retraction means is provided to the lid body.

3. The substrate storage container according to claim 2, wherein the placement piece forced retraction means is a sloped face that is formed at an inner face wall of the lid body, the sloped face abutting a member that is provided in a linked manner to the substrate placement piece accompanying the lid body being attached to the substrate transfer opening, so as to move the member provided in a linked manner to the substrate placement piece, whereby the substrate placement piece moves to the retracted position.

4. The substrate storage container according to claim 2, wherein the placement piece return means is a return spring that biases the substrate placement piece towards the supporting position, the return spring being elastically deformed by the placement piece forced retraction means when the lid body is attached to the substrate transfer opening, and the return spring returning to a state prior to being elastically deformed and causing the substrate placement piece to return to the supporting position, when the lid body is removed from the substrate transfer opening.

* * * * *